United States Patent [19]

Oguro

[11] Patent Number: 5,464,795
[45] Date of Patent: Nov. 7, 1995

[54] METHOD OF FORMING POLYCRYSTALLINE SILICON THIN FILMS FOR SEMICONDUCTOR DEVICES

[75] Inventor: Shizuo Oguro, Tokyo, Japan

[73] Assignee: NEC Corporation, Tokyo, Japan

[21] Appl. No.: 203,559

[22] Filed: Mar. 1, 1994

[30] Foreign Application Priority Data

Mar. 2, 1993 [JP] Japan .................................. 5-040800

[51] Int. Cl.$^6$ .................................................. H01L 21/20
[52] U.S. Cl. ........................................... 437/233; 437/101
[58] Field of Search ................................. 437/233, 109, 437/101, 967; 148/DIG. 122

[56] References Cited

U.S. PATENT DOCUMENTS

| | | | |
|---|---|---|---|
| 4,441,249 | 4/1984 | Alspector et al. | 437/233 |
| 4,843,022 | 6/1989 | Yamazaki | 437/233 |
| 4,877,753 | 10/1989 | Freeman | 437/233 |
| 4,891,330 | 1/1990 | Guha et al. | 437/101 |
| 5,064,779 | 11/1991 | Hasegawa | 437/109 |
| 5,096,856 | 3/1992 | Freeman | 437/233 |
| 5,180,690 | 1/1993 | Czubatyj et al. | 437/233 |
| 5,198,387 | 3/1993 | Tang | 437/233 |
| 5,208,479 | 5/1993 | Mathews et al. | 437/233 |
| 5,225,378 | 7/1993 | Ushikawa | 437/233 |
| 5,227,329 | 7/1993 | Kobayashi et al. | 437/101 |
| 5,242,855 | 9/1993 | Oguro | 437/233 |
| 5,256,566 | 10/1993 | Bailey | 437/233 |
| 5,266,504 | 11/1993 | Blouse et al. | 437/109 |
| 5,310,698 | 5/1994 | Wild | 437/233 |
| 5,370,039 | 12/1994 | Oguro | 437/101 |
| 5,372,958 | 12/1994 | Miyasaka et al. | 437/247 |

OTHER PUBLICATIONS

"Novel Highly Conductive Polycrystalline Silicon Films reducing Processing Temperature Down to 650° C.", Extended Abstracts of the 20th Conference on Solid State Device . . . T. Kobayashi et al. Tokyo 1988, pp. 57–60.

"Deposition and electrical properties of in situ phosphorus–doped silicon films formed by low–pressure chemical vapor deposition", ]1987 American Institute for Physics, Arthur J. Learn et al. Mar. 1, 1987, pp. 1898–1904.

"Solubility of Implated Dopants in Polysilicon: Phosphorus and Arsenic", N. Lifshitz, Murray Hill, New Jersey, Solid–State Science and Technology, Dec. 1983, pp. 2464–2467.

Primary Examiner—Olik Chaudhuri
Assistant Examiner—S. Mulpuri
Attorney, Agent, or Firm—Young & Thompson

[57] ABSTRACT

A semiconductor thin film is formed by depositing an amorphous silicon thin film and heat-treating the deposited amorphous silicon thin film. The amorphous silicon thin film is formed by a chemical vapor deposition (CVD) process while a dopant impurity is introduced, the film being not thicker than 50 nanometers. In the reaction gases used, the ratio (D/S) between the numbers S and D of atoms of silicon and dopant impurity in reaction gases is as large as 0.05~0.2. The polycrystalline silicon thin film thus formed is with reduced electrical resistivities.

5 Claims, 6 Drawing Sheets

FIG. IA
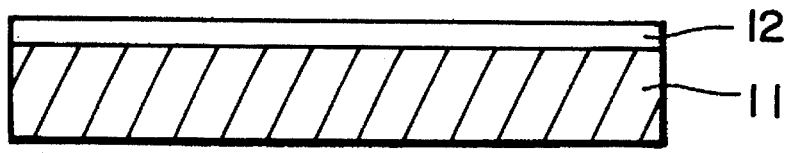
FIG. IB
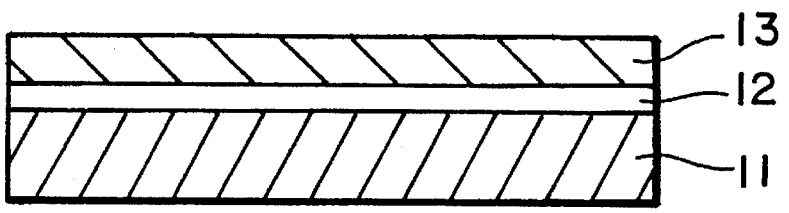
FIG. IC
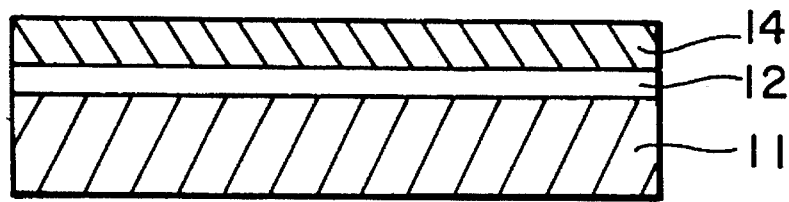

METHOD OF FORMING POLYCRYSTALLINE SILICON THIN FILMS FOR SEMICONDUCTOR DEVICES

BACKGROUND OF THE INVENTION

1. Field of the Invention

This Invention relates to a method of forming semiconductor thin films, and more particularly to a method of forming polycrystalline silicon thin films which are adapted to wide applications to various electrodes and interconnect materials of semiconductor devices.

2. Description of the Related Art

Polycrystalline silicon thin films have important roles as various electrode and interconnect or wiring materials, resistors and semiconductor device materials. For example, they are used for the capacity electrodes and gate electrodes of memory devices and also buried contact materials between active layers and interconnect layers of a device. Further, recently, a polycrystalline silicon thin film transistor (TFT) has been developed, in which the polycrystalline silicon thin film itself is used as a device active layer, and thus polycrystalline silicon thin films are finding practical applications as load elements of SRAM (static RAM) or liquid crystal drive elements for liquid crystal display (LCD).

For forming these polycrystalline silicon thin films, there is a method, in which a polycrystalline silicon thin film is deposited directly by a chemical vapor deposition (CVD) process using a silane type gas (silane $SiH_4$, disilane $Si_{12}H_6$) as the source gas and at a film formation temperature of about 650° C., or a method, in which an amorphous silicon thin film is deposited at a film formation temperature of about 500° C., followed by a heat treatment (i.e., a crystallizing treatment) by holding a certain temperature of 600°~900° C. thereby to obtain a polycrystalline silicon thin film. For example, such a method has been reported by Kobayashi et al, "Abstracts of the 20th Conference on Solid State Devices and Materials", 1989, pp. 57–60.

Particularly, the polycrystalline silicon thin films formed in the latter method have advantages over those formed in the former method in that their resistivity can be reduced more and in that they have less crystal grain boundaries which have strong influence on transistor characteristics. Thus, tills latter method is now attracting attention, and vigorous development is being made for its application to thin films for TFTs and also for providing future methods of forming various electrodes.

A prior art example of the method of forming a polycrystalline silicon thin film through crystallization of amorphous silicon will now be described. First a thermal oxide film is grown to 100 nanometers on a single crystal silicon substrate, and then an amorphous silicon thin film of 150 nanometers is formed using a usual LP-CVD (low-pressure chemical vapor deposition) furnace, thus producing an amorphous silicon substrate. As film formation conditions, for instance. the pressure is set to 0.15 Torr, the temperature to 470° C. and the source gas flow rate of 100%-$Si_2H_6$ to 96 sccm and that of He base 4%-$PH_3$ to 120 sccm. Then, tile amorphous silicon thin film is crystallized by carrying out a heat treatment using an electric furnace and by holding the furnace temperature at 850° C. for 30 minutes in, for example, a nitrogen atmosphere, thus obtaining a polycrystalline silicon substrate. If the ratio between the P and Si atom numbers in the reaction gas obtained from the gas streams of $PH_3$ and $Si_2H_6$ is set to $P/Si=2.5\times10^{-2}$ for tile amorphous silicon film formation, the concentration of P in the film after the crystallization is about $2\times10^{20}$ $cm^{-3}$. Where the concentration of P in the film is as high as this value, after the crystallization, a polycrystalline silicon film with a sufficiently low resistivity can be obtained, the resistivity being about $6\times10^{-6}$ $\Omega.m$.

By varying tile P/Si ratio in the reaction gas when forming tile amorphous silicon film, the concentration of P in the polysilicon film after the crystallization is varied thereby to vary the electrical resistivity (see FIG. 3).

As is seen from FIG. , in a region where the P/Si ratio is small, the resistivity of the film is reduced as the P/Si ratio in the reaction gas increases. However, the resistivity is no longer reduced when the ratio of about $P/Si=1\times10^{-2}$ is reached, and further resistivity reduction cannot be expected by any further increase in the P/Si ratio. Rather, an excess of P deteriorates the crystallinity of the polycrystalline silicon, thus even tending to show a slight increase in the resistivity. Accordingly, in the prior art a P/Si value of $2\sim3\times10^{-2}$ has been used as a condition for the low resistivity polycrystalline silicon film formation.

With furtherance of an integration density increase in semiconductor devices, polycrystalline silicon as electrode material is required to be used for very small areas. For example, practical polycrystalline silicon film thickness reduction is in progress in such applications as burying of contact holes with diameters of 0.2 μm or below and also burying narrow areas of 0.1 μm an or below as seen in the formation of complicated three-dimensional capacitors.

However, where the conditions as in the prior art are adopted for the film formation, the phenomenon seen is that, as the polycrystalline silicon film thickness is reduced, the resistivity increases sharply starting from the neighborhood of 50 nanometers (see FIG. 2). Actually, the resistivity, which has been $6\times10^{-6}$ $\Omega.m$ with a film thickness of 100 nanometers, is increased by more than one order of magnitude, i.e., to $6.5\times10^{-5}$ $\Omega.m$ with a film thickness of 25 nanometers, and it is further increased with further film thickness reduction. In the thin film growth, however, the P concentration in the film is substantially the same as in the case of tile thicknesses used in the prior art.

This phenomenon is a significant obstruction in the application of polycrystalline silicon films as various electrode materials of semiconductor devices with highly increased integration density. Accordingly, it is necessary to seek a method which enables to form polycrystalline silicon films of sufficiently low resistivities, even with thicknesses thereof being as small as 50 nanometers or below.

SUMMARY OF THE INVENTION

An object of tile present invention, therefore, is to overcome the problems existing in tile prior art and to provide a method of forming semiconductor thin films which have low resistivities.

According to one aspect of the invention, there is provided a method of forming a semiconductor thin film, the method comprising the steps of:

introducing a dopant impurity;

depositing an amorphous silicon thin film by a chemical vapor deposition (CVD) process while the dopant impurity is being introduced, and heat-treating the deposited amorphous silicon thin film for polycrystallization, the deposited amorphous silicon thin film having a thickness of 50 nanometers or below, and the dopant impurity having an atom number D in a ratio with respect to a silicon (Si) atom number S in a reaction gas such that the ratio D/S is 0.05~0.2.

The invention provides a method of manufacturing a polycrystalline silicon thin film, which is doped with a dopant impurity for reducing the resistivity. Specifically, amorphous silicon is deposited while introducing a dopant and then polycrystallized by a heat treatment, and for a desired amorphous silicon thin film thickness of 50 nanometers or below, the ratio of the dopant introduction gas flow rate to the source gas flow rate used is higher than that in the prior art. Typically, the invention features that the ratio (D/S) off the dopant atom number D to the silicon atom number S in the reaction gas for film formation is increased to 0.05~0.2, thus forming an amorphous silicon thin film, the resistivity of which is reduced by subsequent polycrystallization.

BRIEF DESCRIPTION OF THE DRAWINGS

The above and other objects, features and advantages of the present Invention will be apparent from the following description of preferred embodiments of the invention explained with reference to the accompanying drawings, in which:

FIGS. 1A to 1C are sectional views showing a semiconductor wafer for explaining a first embodiment of the invention;

PREFERRED EMBODIMENTS OF THE INVENTION

Now, preferred embodiments of the invention will be described hereunder with reference to the accompanying drawings.

FIGS. 1A to 1C are sectional views showing semiconductor wafers for describing a first embodiment of the invention. An aim of this embodiment is to obtain a low resistivity polycrystalline silicon Film having a very small thickness.

As shown in FIG. 1A, on a p-type silicon substrate 11 with plane orientation <100> and a resistivity of $1\times10^{-2}$ $\Omega$.m, an oxide film 12 of 100 nanometers in thick is formed. Then, as shown in FIG. 1B, a plurality of amorphous silicon thin films 13 doped with phosphorus (P) and having a thickness of 10~100 nanometers are formed using a usual batch type LP-CVD system with a resistive heating furnace. As conditions for the film formation, the reaction tube inner temperature is set to 470° C., and the pressure to 0.15 Torr. As tile reaction gases, 100%-$Si_2H_6$ and He base 4%-$PH_3$ gases are supplied at respective flow rates of 96 sccm and 120~480 sccm. The P/Si value of the reaction gas under the above conditions is $2.5\times10^{-2}$ ~$1\times10^{-1}$. Then, as shown in FIG. 1C, the amorphous silicon thin film 13 is heat treated in a nitrogen atmosphere at 850° C. for 30 minutes, thus forming a polycrystalline silicon thin film.

Figure 2:
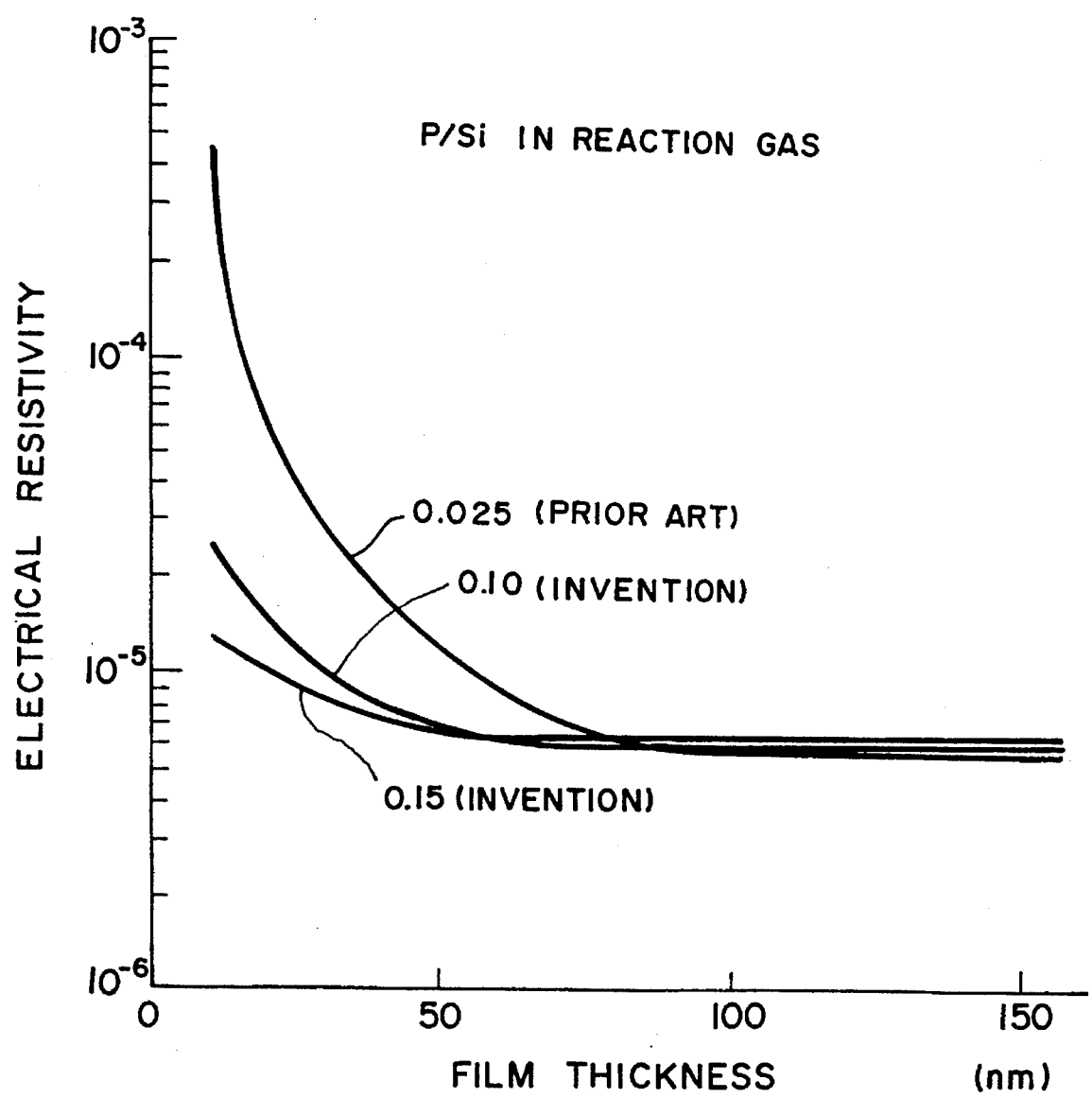
FIG. 2 is a graph which shows the correlation between the thicknesses and the resistivities of the polysilicon thin film with variations in tile P/Si values and which compares such correlation in the invention with that in the prior art.
Figure 3:
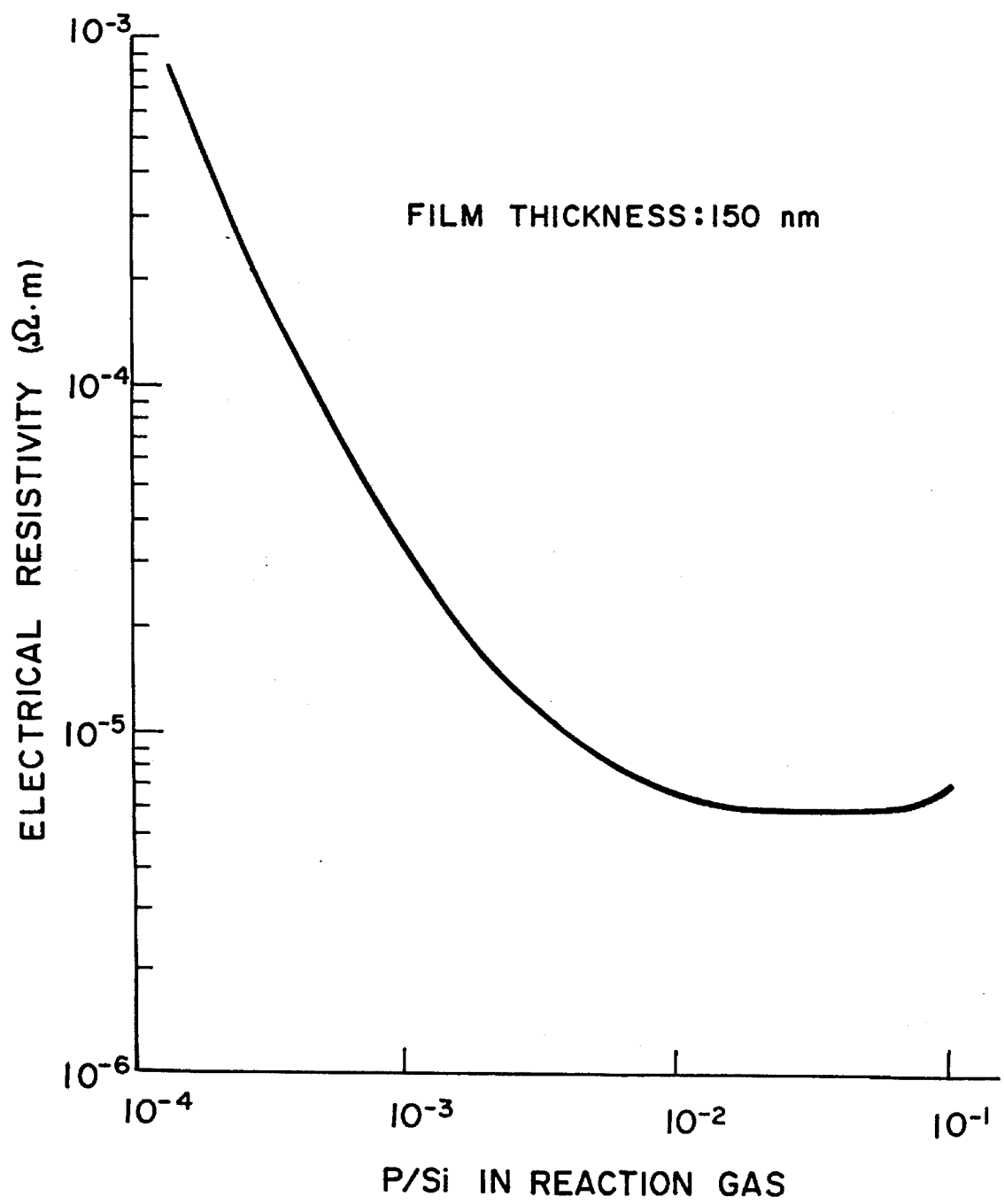
FIG. 3 is a graph showing the correlation between the P/Si values and the resistivities.

FIG. 2 shows the resistivity, plotted against the film thickness, of polycrystalline silicon thin film formed in a prior art example of the film formation method with P/Si set to $2.5\times10^{-2}$. As noted earlier, in this film formation with this value of P/Si the resistivity is sufficiently low, i.e., $6\times10^{-6}$ $\Omega$.m, for film thicknesses of 100 nanometers and above but, after the polycrystallization, the resistivity of tile polycrystalline silicon increases sharply as tile thickness of the amorphous silicon film is reduced to the neighborhood of 50 nanometers.

With the means according to the invention, it is possible to reduce the resistivity even with a film having a very small thickness which is subject to resistivity increase if made according to the above prior art film formation method.

Figure 4:
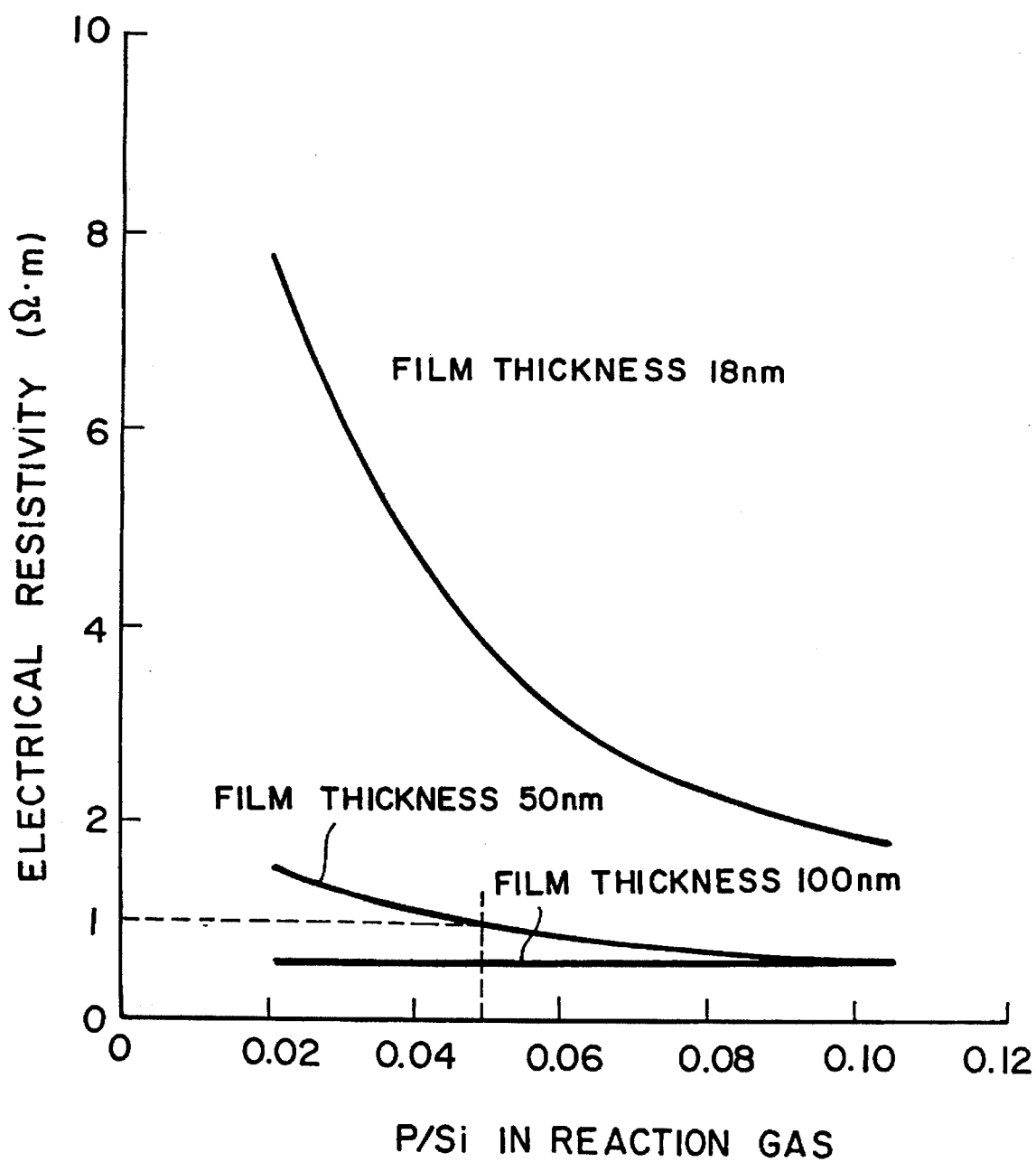
FIG. 4 is a graph showing also the correlation between the P/Si values and the resistivities (when P/Si values increased)

FIG. 4 shows tile resistivities of polycrystalline silicon films with thicknesses of 18, 50 and 100 nanometers, plotted against the P/Si value for the film formation. which is increased from $2.0\times10^{-2}$ to five times thereof, i.e., $1\times10^{-1}$. As is seen with the polycrystalline silicon film with the thickness of 100 nanometers or above, the resistivity is sufficiently reduced at P/Si of $2\times10^{-2}$ and is no longer reduced by further increasing the P/Si value. On tile other hand, with the film with the thickness of 50 nanometers the resistivity is reduced from $1.5\times10^{-5}$ $\Omega$.m to $1\times10^{-5}$ $\Omega$.m by increasing tile P/Si value from $2\times10^{-2}$ to $5\times10^{-2}$, the latter resistivity value being sufficiently low for the application of the film to various electrode materials. Further, by further increasing the P/Si value to $1\times10^{-1}$, the resistivity is reduced down to a value comparable with that of the film with the thickness of 100 nanometers.

FIG. 2 shows the resistivities, plotted against the film thickness, obtained with P/Si values of $1\times10^{-1}$ and $1.5\times10^{-1}$ together with those in the prior art example. As is seen, the resistivities can be reduced down to $1\times10$–5 $\Omega$.m for film thicknesses down to about 30 nanometers with P/Si of $1\times10^{-1}$ and for film thicknesses down to about 20 nanometers with P/Si of $1.5\times10^{-1}$.

In the method according to the invention, the P/Si value is set to be $5\times10^{-2}$ ~$2\times10^{-1}$. This is done so because if the value is above this range, excessive P atoms are introduced into the film resulting in an increase in the resistivities oppositely due to such causes as deterioration of the crystallinity or carrier impurity disturbance.

As shown above, in this embodiment, unlike in the prior art, it is possible to form a low resistivity polycrystalline silicon thin film with a thickness of 50 nanometers or below. While this embodiment relates to films doped with phosphorus (P), it is possible to obtain similar effects (i.e.. reduction in resistivity) in cases where other dopant impurities, such as arsenic (As) or boron (B), are introduced.

FIGS. 5A to 5D are sectional views showing semiconductor wafers for describing a second embodiment of the invention. In this second embodiment, the invention is applied to a buried contact material between a device active layer and an interconnect layer in various semiconductor devices.

Figure 5A:
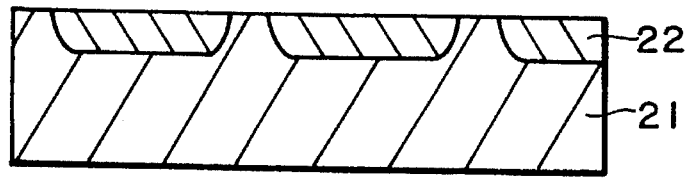
FIGS. 5A–5D are sectional views of a semiconductor wafer for showing fabrication steps thereof as a second embodiment according to tile invention.
Figure 5B:
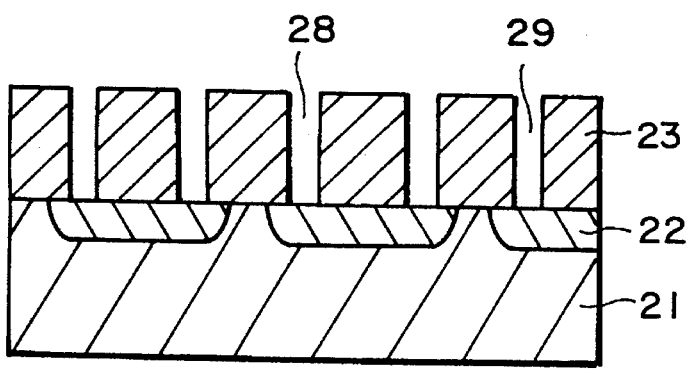

First, as shown in FIG. 5A, arsenic (As) is ion implanted into a p-type silicon substrate 21 of plane orientation <100> from a principal surface to form an $n^+$-type diffusion layer 22. Then, as shown in FIG. 5B, a silicon oxide layer 23 with a thickness of 1 μm is formed over the entire surface, and then contact holes 28 with a diameter of 0.15 μm and a depth of 0.5 μare formed by photolithographic and ion etching processes.

Figure 5C:
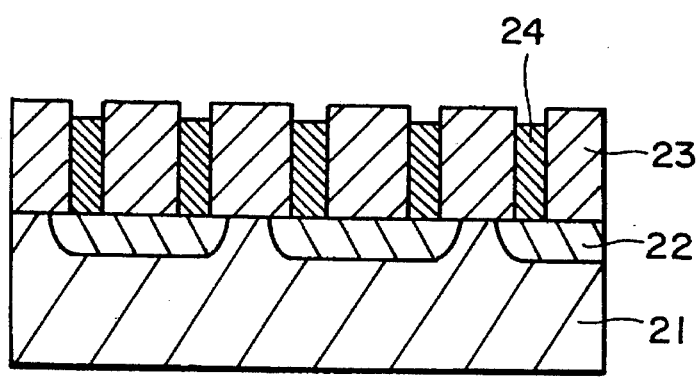

Then, as shown in FIG. 5C, as in the first embodiment, an amorphous silicon thin film is formed to a thickness of 100 nanometers over the entire surface while doping with phosphorus (P) with the P/Si value for the film formation set to $2.5 \times 10^{-2}$ (prior art example) and $1 \times 10^{-1}$ (embodiment), followed by a heat treatment at 850° C. for 30 minutes to crystallize the amorphous silicon thin film, thus forming a polycrystalline silicon thin film. Thereafter, the polycrystalline silicon thin film over the oxide film is removed by the ion etching process.

Figure 5D:
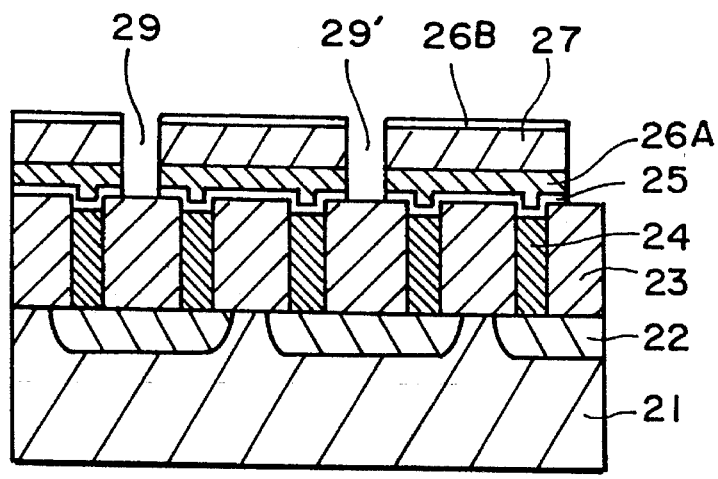

Then, as shown in FIG. 5D, a titaniuim (Ti) film 25, a titanium nitride (TiN) film 26A, an Al—Si—Cu alloy film 27 and a titanium nitride (TiN) film 26B, with respective thicknesses of 30, 100, 550 and 30 nanometers, are deposited in the mentioned order by the spattering process, thus forming an outer electrode. In tills outer electrode, isolation grooves 29 are formed to provide 1,000 polycrystalline silicon contact plug sections arranged in series. In the above process of producing a contact resistance evaluation substrate, the prior art method and the method of this embodiment are different only in the P/Si value for the amorphous silicon thin film formation, and the remainder of the process is all the same.

With the contact resistance evaluation substrate thus produced, the contact resistance is measured. In the second embodiment, the resistance per contact is 450 Ω, which is extremely low compared to the resistance (800~1,000 Ω) obtained in the case of the prior art method. It has been found that, by using the means of this embodiment, it is possible to form very small contacts with diameters of about 0.15 μm, which greatly contributes to the integration density increase of future semiconductor devices. Further, the same effect is obtainable by carrying out the film formation in the second embodiment with the P/SI value set to three times the prior art value.

Figure 6A:
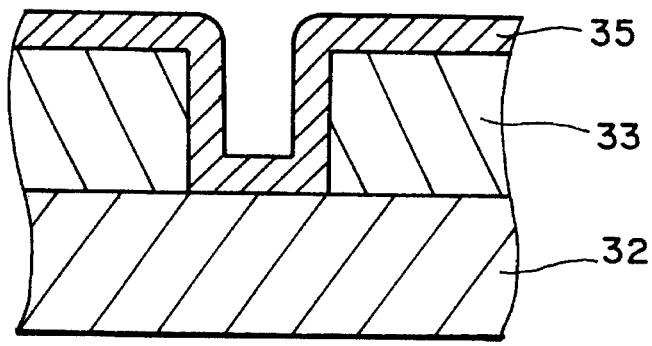
FIGS. 6A–6C are sectional views of a semiconductor wafer for showing fabrication steps thereof as a third embodiment according to the invention.
Figure 6B:
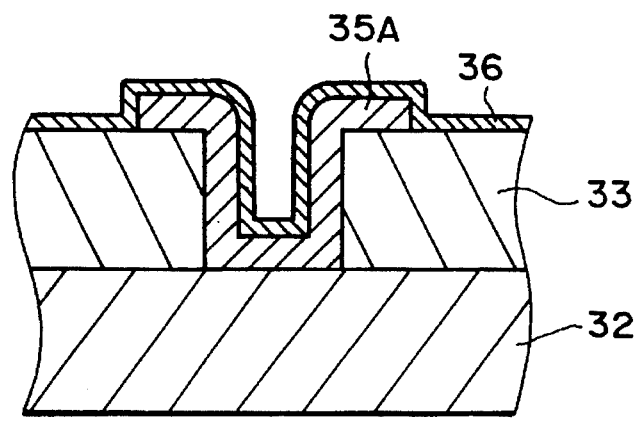
Figure 6C:
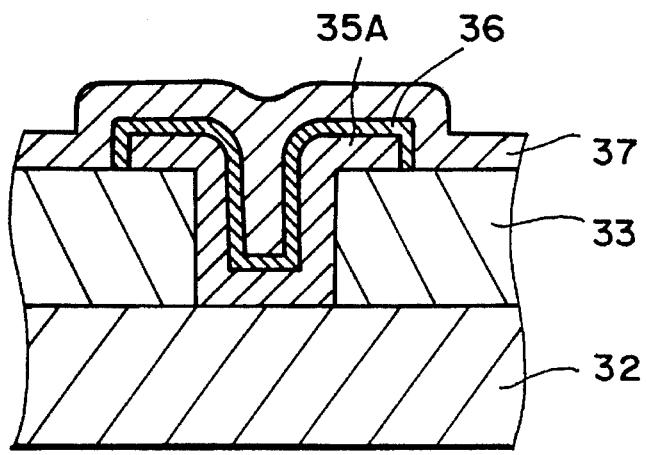

FIGS. 6A to 6C are sectional views showing semiconductor wafers for describing a third embodiment of the invention. In this third embodiment, the invention is applied to a memory device capacity electrode.

First, as shown in FIG. 6A, arsenic (As) is ion implanted into a p-type single crystal silicon substrate with plane orientation <100> from one principal surface thereof to form an $n^+$-type diffusion layer 32. Then, a silicon oxide film 33 with a thickness of 1 μm is formed on the layer 32 by thermal oxidization, and a groove with a width of 1 μm is formed in the oxide film 33. Then, as in the second embodiment, an amorphous silicon thin film 35 is formed to thicknesses of 30 and 100 nanometers while doping with phosphorus (P) with the P/Si value for the film formation set to $2.5 \times 10^{-2}$ (prior art example) and $7.5 \times 10^{-2}$ (embodiment), followed by a heat treatment at 850° C. for 30 minutes for polycrystallization, thus forming a polycrystalline silicon thin film 35.

Then, as shown in FIG. 6B, the polycrystalline silicon thin film 35 is patterned to form an inner electrode 35A, and then a capacity insulation layer 36 is formed to a thickness of 5 nanometers. Then, as shown in FIG. 6C, an amorphous silicon film with a thickness of 150 nanometers is formed for an outer electrode 37, followed by a heat treatment at 850° C. for 30 minutes for polycrystallization.

The capacity characteristics of the capacity electrode thus produced are then measured. Table 1 below shows the ratio ($C/C_O$) between the capacitance C when a voltage of +3 V is applied to tile inner electrode and tile capacitance $C_O$ in the neighborhood of zero bias, as determined by the high frequency C-V characteristics.

TABLE 1

| Inner electrode film thickness | C-V CHARACTERISTICS | | | |
|---|---|---|---|---|
|  | 100 nm | | 30 nm | |
| P/Si ($\times 10^{-2}$) | 2.5 | | 7.5 | |
| $C/C_o$ | 0.98 | | 0.85 | 0.94 |

As is seen from Table 1, according to the prior art method, by reducing tile inner electrode film thickness from 100 nanometers to 30 nanometers, the $C/C_O$ value is reduced from 0.98 to 0.85, thus indicating the spread of carrier depletion layer in the inner electrode polycrystalline silicon. In contrast, with the third embodiment, the $C/C_O$ value is 0.94 and thus is not substantially reduced. This means that, compared to the prior art example, a sufficient amount of carriers is present in the polycrystalline silicon, thus enabling to form a satisfactory electrode. Therefore, the invention permits sufficient capacitance characteristics to be obtained even when the capacity structure is complicated with an increase in integration density of the semiconductor device.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of forming a semiconductor thin film, the method comprising the steps of:

introducing a dopant impurity;

depositing an amorphous silicon thin film by a chemical vapor deposition (CVD) process while said dopant impurity is being introduced, and heat-treating said deposited amorphous silicon thin film for polycrystallization, said deposited amorphous silicon thin film having a thickness of 50 nanometers or below, and said dopant impurity having number of atoms D in a ratio with respect to a silicon (Si) having number of atoms S in a reaction gas such that the ratio D/S is 0.05~0.2.

2. The method of forming a semiconductor thin film according to claim 1, in which at least one gas selected from a group consisting of silane ($SiH_4$) and disilane ($Si_2H_6$) gases is used as the source gas for the CVD process.

3. The method of forming a semiconductor thin film according to claim 1, in which a gas selected from a group consisting of phosphine ($PH_3$) and tertiary butylphosphine is used as the dopant impurity introduction gas in the CVD process.

4. The method of forming a semiconductor thin film according to claim 1, in which a gas selected from a group consisting of arsine ($AsH_3$) arsenic trichloride ($AsCl_3$) and tertiary butylarsine is used as the dopant impurity introduction gas in the CVD process.

5. The method of forming a semiconductor thin film according to claim 1, in which diborane ($B_2H_6$) is used as the dopant impurity introduction gas in the CVD process.

* * * * *